(12) United States Patent
Hongo

(10) Patent No.: US 7,679,439 B2
(45) Date of Patent: Mar. 16, 2010

(54) PREDISTORTER

(75) Inventor: Naoki Hongo, Kodaira (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/372,166

(22) Filed: Feb. 17, 2009

(65) Prior Publication Data

US 2009/0160550 A1    Jun. 25, 2009

Related U.S. Application Data

(62) Division of application No. 11/667,336, filed as application No. PCT/JP2005/022705 on Dec. 5, 2005, now Pat. No. 7,511,574.

(30) Foreign Application Priority Data

Feb. 17, 2005  (JP) .............................. 2005-040350

(51) Int. Cl.
    *H03F 1/26*    (2006.01)
(52) U.S. Cl. ...................... 330/149; 375/297
(58) Field of Classification Search ................ 330/149; 375/297; 455/114.3
    See application file for complete search history.

(56) References Cited

U.S. PATENT DOCUMENTS 6,621,340 B1 *  9/2003  Perthold et al. ............. 330/149
6,630,862 B1 * 10/2003  Perthold et al. ............. 330/149
7,098,734 B2 *  8/2006  Hongo et al. ............... 330/149
2001/0005402 A1  6/2001  Nagatani et al.
2004/0004516 A1  1/2004  Maniwa

FOREIGN PATENT DOCUMENTS

JP   2001-189685    7/2001
JP   2004-40564     2/2004
JP   2004-320329    11/2004

OTHER PUBLICATIONS

International Search Report issued Mar. 14, 2006 in the International Application No. PCT/JP2005/022705.
A. Ahmed et al., "*Power Amplifier Linearization Using Memory Polynomial Predistorter with Non-uniform Delay Taps*", Microwave Symposium Digest, 2004 IEEE MTT-S International, vol. 3, Jun. 6, 2004, pp. 1871-1874.
First Notification of Reason for Refusal (with English translation) dated Oct. 17, 2008 from Chinese Patent Office Action in Application No. 2005800428598.

* cited by examiner

*Primary Examiner*—Henry K Choe
(74) *Attorney, Agent, or Firm*—Wenderoth, Lind & Ponack, L.L.P.

(57) ABSTRACT

A predistorter for correcting distortion caused by a memory effect in amplifying a signal by an amplifier is provided. In the memory PD 2 provided to the predistorter, the level detection means 21 detects the level of the signal, the coefficient output means 22 outputs the coefficient corresponding to the detected level, the delay means 23 delays the output coefficient, the difference detection means 24 detects the difference between the output coefficient and the delayed coefficient, the multiplication means 25 multiplies the detected difference with the signal, and the combination means 26 combines the result of the multiplication and the signal. Thus, the result of the combination is output to the amplifier.

1 Claim, 6 Drawing Sheets

PREDISTORTER

This is a divisional application of Ser. No. 11/667,336, filed Jun. 20, 2007, now U.S. Pat. No. 7,511,574, which is the National Stage of International Application No. PCT/JP2005/022705, filed Dec. 5, 2005.

TECHNICAL FIELD

The present invention relates to a predistorter for correcting distortion caused in an amplifier, and in particular to a predistorter for correcting an effect of the memory effect of an amplifier caused by supply voltage variation.

BACKGROUND ART

In, for example, a base station device in a mobile communication system adopting the wideband code division multiple access (W-CDMA) method as a mobile communication method, since it is required to have a radio signal reach the remote mobile communication device, it is required to significantly amplify the signal by a power amplifier. In general, the output of the power amplifier linearly varies in an area with low input, but with the input exceeding a certain input level, the output becomes nonlinear, and goes into saturation. Since the power amplifier is typically used at an operating point near to the saturation point in order for improving the power efficiency, nonlinear distortion is caused by the nonlinearity of the amplifier.

Although the transmitter signal before amplification is suppressed in a low level since the signal component in other signal bands than the desired signal band is removed by a bandlimiting filter, a signal component of the signal after passing through the power amplifier leaks to the other signal bands (adjacent channels) than the desired signal band because of the generated nonlinear distortion. In, for example, the base station device, because of the high transmission power as described above, energy of the leakage electric power to the adjacent channels described above is strictly regulated, and accordingly, how to reduce such leakage electric power to the adjacent channels has become a major issue.

A predistortion method can be cited as one of distortion correction methods for correcting such nonlinear distortion of the power amplifier, and is becoming mainstream displacing the feedforward method because the power efficiency is emphasized in recent years.

The predistortion method is a method of correcting the distortion caused in the power amplifier by previously providing the input signal to the amplifier with the inverse characteristic of the AM-AM conversion and the AM-PM conversion, which are the nonlinear characteristics of the power amplifier.

FIG. 6 shows a configuration example of a functional block of an amplifier with a predistorter, which is composed of a power amplifier using the predistortion method.

An example of an operation performed by the amplifier with predistorter according to the present embodiment will be described.

An input signal to the amplifier with predistorter is input to an electric power detection section 71 and a predistortion section 73. The electric power detection section 71 detects the electric power (or alternatively the amplitude) of the input signal, and outputs the detection result to a distortion correction table 72 as a reference argument.

The distortion correction table 72 is configured as a look-up table (LUT) using, for example, a memory, and stores values for performing the distortion correction by the predistortion method, corresponding to the detection result of the electric power detection section 71 as the reference argument (address). Specifically, the distortion correction table 72 stores values of the AM-AM characteristic regarding the amplitude and the AM-PM characteristic regarding the phase generally taking the power or the amplitude of the input signal as an index, which are the inverse characteristics of the nonlinear characteristic of the amplifier (an amplifying section 74) to be the correction target.

The distortion table 72 outputs the value, which corresponds to the detected result input from the electric power detection section 71, to the predistortion section 73. The predistortion section 73 corrects the amplitude and the phase of the input signal in accordance with the value of the reference result input from the distortion correction table 72, and outputs the signal after thus corrected to the amplifying section 74.

The amplifying section 74 is composed of a power amplifier, and amplifies and then outputs the signal input from the predistortion section 73. The output signal is then output from the amplifier with the predistorter. It should be noted here that the signal input to the amplifying section 74 is previously provided with the distortion (amplitude distortion or phase distortion) corresponding to the inverse characteristic of the distortion characteristic of the power amplifier in the predistortion method, and by canceling this distortion and the distortion caused in the power amplifier each other, the output signal becomes a signal without distortion.

In order for accommodating the temperature variation, the secular variation, and so on, a control section 75 updates the storage content of the distortion correction table 72 based on input signals and output signals of the amplifier with the predistorter.

FIG. 7 shows a configuration example of the predistorter for performing digital processing.

An example of an operation performed by the predistorter according to the present embodiment will be described.

The input signal to the predistorter is input to an envelope detector 81 and a complex multiplier 83. The envelope detector 81 calculates sqrt $(I^2+Q^2)$ to an in-phase (I) component "I" and a quadrature-phase (Q) component "Q" of the input signal for every sample to detect the instantaneous power (corresponding to the envelope in the RF band), and outputs the detection result to the LUT 82.

The LUT 82 is a distortion correction table composed of a memory or the like, and stores the values for controlling the distortion correction in the form of a complex vector in correspondence with the detection results by the envelope detector 81 as the reference argument (address), in the present embodiment. The LUT 82 outputs the corresponding complex vector for the distortion correction to the complex multiplier 83 using the detection result by the envelope detector 81 as the argument (address) of the table.

The complex multiplier 83 performs the complex multiplication on the input signal and the complex vector input from the LUT 82 and outputs them. Thus, the predistortion process is performed, and the output signal is output from the predistorter. It is common that digital predistorters operate with a sampling frequency several through several tens times as high as the transmission signal band width in order for correcting third, fifth, or higher order of mutual modulation distortion.

Patent Document 1: JP-A-2001-189685
Patent Document 2: JP-A-2004-040564
Patent Document 3: JP-A-2005-217690

DISCLOSURE OF THE INVENTION

However, in the mechanism of generation of distortion in an amplifier, there is one whose present state changes in accordance with the past state such as represented by the memory effect besides the AM-AM characteristic or the AM-PM characteristic by the instantaneous power. For example, if the instantaneous power is the only index for referring to the distortion correction table, the nonlinear distortion generated by the memory effect cannot perfectly be corrected. Further, the mechanism of the memory effect is studied in various ways, but has not been clearly resolved, and it is thought that a great number of the mechanisms of the memory effect exist.

In the present specification, it will be explained that the variation in the power supply voltage of the amplifier can be cited as one of the causes of generating the memory effect, and an embodiment regarding a predistorter for correcting the distortion caused therefrom will be presented.

FIG. 8 shows an example of a model of a transistor suffering from the effect of the memory effect.

The model is composed of a transistor 91 formed of a field effect transistor (FET) and an inductance 92 with an inductance value of L. The inductance 92 is a parasitic inductance existing in the bias circuit or the output matching circuit of the transistor 91.

The current I(t) flowing through the drain bias circuit and then through the drain is converted into a voltage signal by the inductance 92. Here, t denotes time.

The voltage signal thus generated prevents the drain-source voltage Vds from being equal to the power supply voltage Vdd, and thus causing the variation in the power supply voltage. The drain-source voltage Vds in which the voltage variation is caused by the inductance 92 with the inductance value of L can be described as Formula 1.

(Mathematical Formula 1)

$$Vds = Vdd - \Delta V \quad \text{(Formula 1)}$$
$$= Vdd - L \cdot (dI(t)/dt)$$

FIG. 9(a) shows an example of the AM-AM characteristic in the case in which the power supply voltage (the drain-source voltage) Vds is used as a parameter. In the graph, the horizontal axis represents the input voltage [dBm], and the vertical axis represents the gain [dB]. As shown in the drawings, the larger the power supply voltage Vds becomes, the greater the gain becomes.

FIG. 9(b) shows an example of the AM-PM characteristic in the case in which the power supply voltage (the drain-source voltage) Vds is used as a parameter. In the graph, the horizontal axis represents the input voltage [dBm], and the vertical axis represents the phase [degree]. As shown in the drawings, it is understood that the passing phase varies in accordance with the power supply voltage Vds.

If the inductance 92 influences, as shown in Formula 1, the power supply voltage (the drain-source voltage) Vds varies in an equivalent manner in accordance with the instantaneous input signal. Since it is the inductance 92, the AM-AM characteristic and the AM-PM characteristic vary dynamically in accordance with the variation in the instantaneous current, namely the differential variation in the envelope. Therefore, in the predistorter for performing amplitude modulation or the phase modulation in accordance with the envelope (the instantaneous power) of the input signal, the distortion caused by the power supply voltage variation cannot perfectly be corrected.

The present invention is made in consideration of such a conventional circumstance as described above, and has an object of providing a predistorter capable of efficiently correcting the effect of the memory effect.

In order for achieving the object described above, in the predistorter according to the present invention, the distortion caused by the memory effect when amplifying the signal by the amplifier can be corrected by the following configuration.

That is, level detection means detects the level of the signal. Coefficient output means outputs a coefficient corresponding to the detected level. Delay means delays the output coefficient. Difference detection means detects the difference between the output coefficient and the delayed coefficient. Multiplication means multiplies the detected difference with the signal. Combination means combines the result of the multiplication and the signal. Then, the result of the combination is output to the amplifier directly or indirectly via another circuit.

Therefore, the effect of the memory effect can effective be corrected using the time difference of the coefficient corresponding to the level of the signal to be the target of the amplification by the amplifier.

It should be noted that the configuration for correcting the effect of the memory effect and the configuration for correcting other effects such as the AM-AM characteristic and the AM-PM characteristic can be used in combination.

Here, as the level of the signal, for example, various kinds such as an amplitude level of the signal or an electric power level of the signal can be used.

Further, as the coefficient corresponding to the signal level, for example, the coefficient capable of reducing the distortion caused by the memory effect is used, and further, can be updated by, for example, feedback control.

Further, as the time amount for delaying the coefficient, various lengths can be used, and the time amount to be the minimum unit, such as a time period for one sampling (1 sample period) can be used.

Further, as the difference between the coefficient advanced in terms of time and the coefficient late in terms of time, either one of what is obtained by subtracting the coefficient late in terms of time from the coefficient advanced in terms of time or what is obtained by subtracting the coefficient advanced in terms of time from the coefficient late in terms of time can be used. Since these are different only in signs of plus and minus from each other, for example, it is enough to adjust the signs of plus and minus in either process.

Further, as the means for detecting the difference between the two signals or the means for combining the two signals, it is possible, for example, to configure the means using the adder for adding the two signals, or to configure the means using the subtracter for subtracting one signal from the other signal.

In the predistorter according to the present invention, the distortion caused by the memory effect when amplifying the signal by the amplifier can be corrected by the following configuration as another configuration example.

That is, the level detection means detects the level of the signal. The coefficient output means outputs a coefficient corresponding to the detected level. The delay means delays the output coefficient. The difference detection means detects the difference between the output coefficient and the delayed coefficient. The multiplication means multiplies the detected difference with the signal. Then, the result of the multiplication is output to the amplifier directly or indirectly via another circuit.

Therefore, the effect of the memory effect can effectively be corrected using the time difference of the coefficient corresponding to the level of the signal to be the target of the amplification by the amplifier.

It should be noted that the configuration for correcting the effect of the memory effect and the configuration for correcting other effects such as the AM-AM characteristic and the AM-PM characteristic can be used in combination.

In the predistorter according to the present invention, the distortion caused by the memory effect when amplifying the signal by the amplifier can be corrected by the following configuration as another configuration example.

That is, the level detection means detects the level of the signal. Amplitude coefficient output means outputs a coefficient relating to the amplitude corresponding to the detected level. Amplitude coefficient delay means delays the coefficient relating to the output amplitude. Amplitude coefficient difference detection means detects the difference between the output coefficient relating to the amplitude and the delayed coefficient relating to the amplitude. Amplitude variation means varies the amplitude of the signal in accordance with the detected difference of the coefficients relating to the amplitude. Further, phase coefficient output means outputs a coefficient relating to the phase corresponding to the detected level. Phase coefficient delay means delays the coefficient relating to the output phase. Phase coefficient difference detection means detects the difference between the output coefficient relating to the phase and the delayed coefficient relating to the phase. Phase variation means varies the phase of the signal in accordance with the detected difference of the coefficients relating to the phase. Further, the signal with the varied amplitude and the varied phase is output to the amplifier directly or indirectly via another circuit.

Therefore, the effect of the memory effect regarding the amplitude and the phase can effectively be corrected using the time difference of the coefficients regarding the amplitude and the time difference of the coefficients regarding the phase in accordance with the level of the signal to be the target of amplification by the amplifier.

It should be noted that the configuration for correcting the effect of the memory effect and the configuration for correcting other effects such as the AM-AM characteristic and the AM-PM characteristic can be used in combination.

Here, as the coefficient relating to the amplitude corresponding to the signal level, for example, the coefficient capable of reducing the amplitude distortion caused by the memory effect is used, and further, can be updated by, for example, feedback control.

Further, as the coefficient relating to the phase corresponding to the signal level, for example, the coefficient capable of reducing the phase distortion caused by the memory effect is used, and further, can be updated by, for example, feedback control.

Further, as the amplitude variation means, for example, it is possible to configure the amplitude variation means using the variable attenuator or the variable amplifier.

Further, as the phase variation means, for example, it is possible to configure the phase variation means using the variable phase shifter.

Further, as the order of applying the amplitude variation and the phase variation to the signal to be the target of amplification of the amplifier, any order can be used, and for example, the phase variation can be applied after application of the amplitude variation, or the amplitude variation can be applied after application of the phase variation.

BEST MODE FOR CARRYING OUT THE INVENTION

An embodiment according to the invention will now be described with reference to the drawings.

In the present embodiment, a predistorter for correcting the distortion caused by the power supply voltage variation, and an amplifier with the predistorter having such a predistorter are described.

Assuming that the cause of generating the memory effect is that the bias variation is caused by the voltage generated by the parasitic inductor, the correction is performed using the following principle.

Specifically, regarding the Formula 1 described above, in the case in which the time $\Delta t$ is a very short period of time, it is described as Formula 2.

(Mathematical Formula 2)

$$Vds = Vdd - L \cdot \{I(t) - I(t - \Delta t)\} / \Delta t \quad \text{(Formula 2)}$$
$$= Vdd - L \cdot \{I(nT) - I((n-1)T)\} / T$$

(where $n$ is an integer)

It should be noted here that in the Formula 2, assuming that $\Delta t$ is a very short period of time and is equal to one sampling period, which is denoted with T, as the minimum time unit in a digital processing system, the difference expression is used. Although T is not limited to one sample, considering that the difference is the approximation of the differential, it is considered that the value as small as possible, namely one sample is preferable. Therefore, in come cases, a higher sampling frequency than usual is more preferable.

In order for following the variation in the difference, in the present embodiment, the predistortion process is performed with a signal obtained by subtracting the delayed output value of the table from the output value at the present time point.

The initial value of the table can be the same as the distortion correction coefficient used in the typical predistorter.

As described above, the predistorter according to the present embodiment is provided with a function of delaying the control signal output from the table storing the distortion correction coefficient representing the distortion correction characteristic, and performs the predistortion process by the signal obtained by subtracting the delayed control signal from the control signal from the table at the present time point.

First Embodiment

A first embodiment of the invention will be explained.

Figure 1:
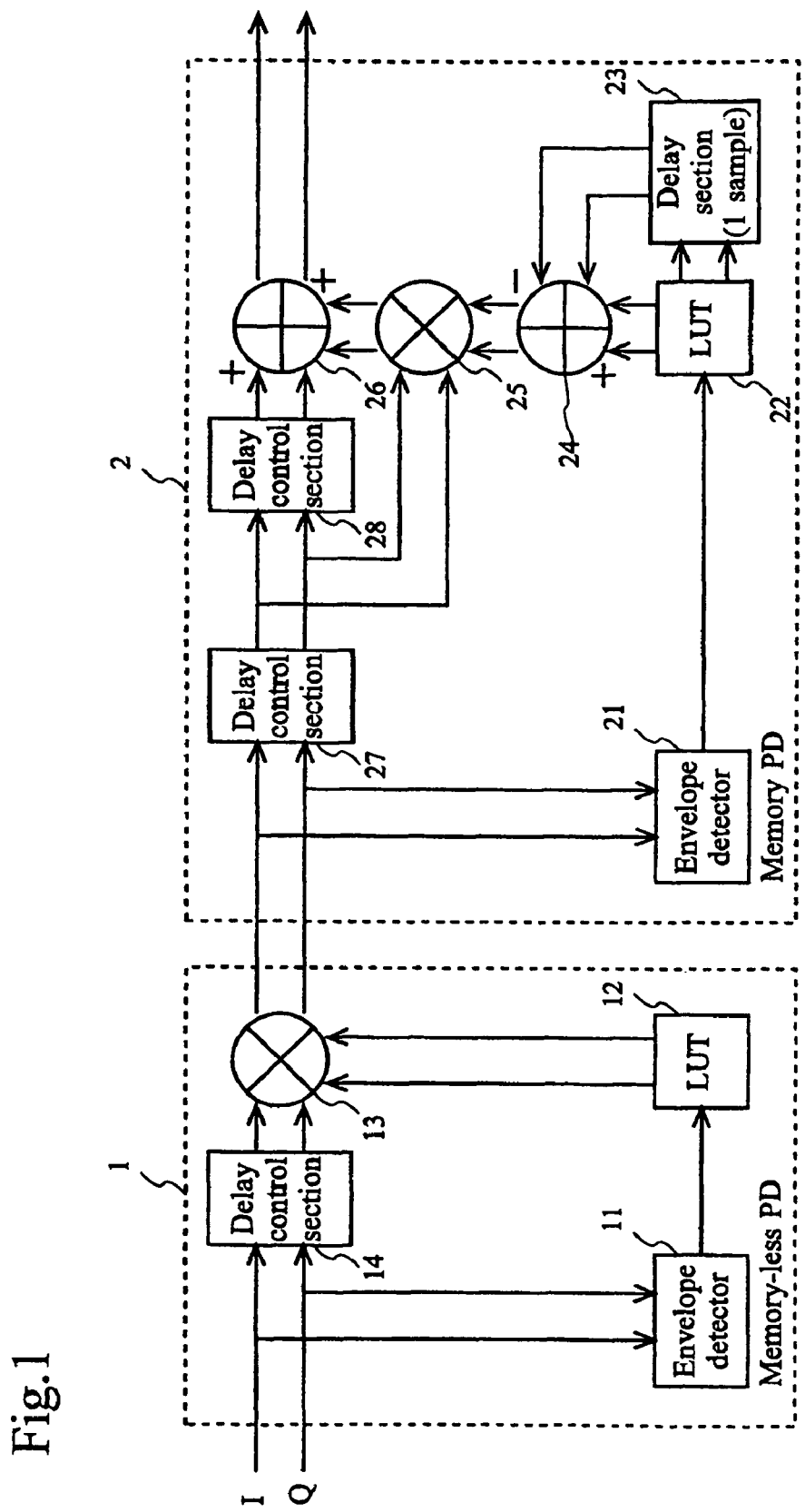
FIG. 1 is a diagram showing a configuration example of a predistorter according to a first embodiment of the invention.

FIG. 1 shows a configuration example of the predistorter for performing digital processing.

The predistorter according to the present embodiment is composed of a memory effect-less predistorter (memory-less PD) 1 and a memory effect predistorter (memory PD) 2.

The memory-less PD 1 is provided with an envelope detector 11, a look-up table (LUT) 12 as adistortion correction table composed by using a memory or the like, a complex multiplier 13, and a delay control section 14 composed of a shift register or the like.

The memory PD 2 is provided with an envelope detector 21, a look-up table (LUT) 22 as a distortion correction table composed by using a memory or the like, a delay section 23 for one sampling period, an adder 24, a complex multiplier 25, an adder 26, a delay control section 27 and a delay control section 28 each composed of a shift register or the like.

It should be noted here that the predistorter according to the present embodiment is composed of two parts, the memory-less PD 1 for correcting the odd number order distortion and the memory PD 2 for correcting the effect of the memory effect, and has a configuration of connecting them in series with each other. Further, as the memory-less PD 1, what is similar to the conventional typical predistorter, which does not correct the effect of the memory effect, can be used, for example.

In the configuration shown in FIG. 1, the upper most lines connecting the right and left sides are main signal lines, and others are for controlling the distortion correction.

Further, the input signal to the predistorter of the present embodiment is an IQ digital baseband signal composed of a complex vector, and in the predistorter in the present embodiment, the process to the I component and the Q component is performed.

An example of an operation performed by the memory-less PD 1 will be described.

The input signal to the predistorter according to the present embodiment is input to the envelope detector 11 and the delay control section 14 of the memory-less PD 1.

The envelope detector 11 detects the square root (envelope) of the instantaneous power of the input signal as the amplitude information, and outputs the detection result to the LUT 12.

The LUT 12 stores the distortion correction coefficients, which have the inverse characteristic (namely the cancellation characteristic) to the AM-AM characteristic and the AM-PM characteristic, as the IQ vectors in correspondence with the amplitude information of the input signal as the reference argument (address). The LUT 12 outputs the table value (the distortion correction coefficient), which is stored in the address corresponding to the amplitude information of the input signal as the detection result input from the envelope detector 11, to the complex multiplier 13.

The delay control section 14 delays the input signal and outputs it to the complex multiplier 13. In this case, the amount of the delay is controlled so that the table value corresponding to the input signal is input to the complex multiplier 13 at the same timing as the input signal.

The complex multiplier 13 performs the complex multiplication on the input signal and the distortion correction coefficient input from the LUT 12, and outputs the signal resulted from the complex multiplication to the memory PD 2. According to this complex multiplication, the AM-AM characteristic and the AM-PM characteristic are corrected.

It should be noted that the table values of the LUT 12 can be made automatically converge into the optimal values using, for example, various known adaptation algorisms.

An example of an operation performed by the memory PD 2 will be described.

The signal input from the memory-less PD 1 is input to the envelope detector 21 and the delay control section 27.

The envelope detector 21 has a similar function to, for example, the envelope detector 11 of the memory-less PD 1, and detects the envelope of the input signal as the amplitude information, and outputs the detection result to the LUT 22.

The LUT 22 stores the distortion correction coefficients, which are capable of generating the inverse characteristic (namely the cancellation characteristic) to the distortion caused by the memory effect, as the IQ vectors, in correspondence with the amplitude information of the input signal as the reference argument (address). The LUT 22 outputs the table value (the distortion correction coefficient), which is stored in the address corresponding to the amplitude information of the input signal as the detection result input from the envelope detector 21, to the delay section 23 and the adder 24.

The delay section 23 is composed of a delay element or the like for delaying the signal for one sampling period in the present embodiment, and delays the distortion correction coefficients input from the LUT 22 for one sampling period and outputs it to the adder 24.

Figure 8:
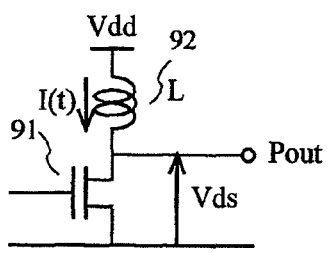
FIG. 8 shows an example of a model of a transistor suffering from the effect of the memory effect.
Figure 9:
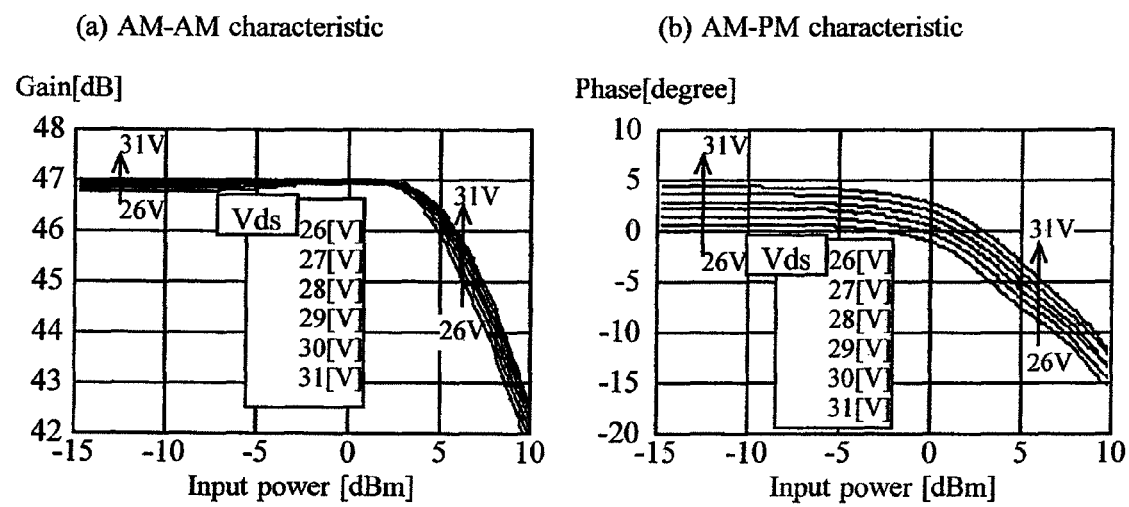
FIG. 9 is a diagram showing an example of the characteristic of an amplifier using the power supply voltage Vds as a parameter.

The adder 24 has a function of calculating the difference between the two signals input thereto, and outputs the result (difference) of subtracting the distortion correction coefficient input from the delay section 23 from the distortion correction coefficient input from the LUT 22 to the complex multiplier 25. The difference corresponds to the differential generated in the inductance 92 provided to the model shown in FIG. 8, for example.

The delay control section 27 delays the input signal and outputs it to the complex multiplier 25 and the delay control section 28. In this case, the amount of the delay is controlled so that the output from the adder 24 corresponding to the input signal (the output from the complex multiplier 13) is input to the complex multiplier 25 at the same timing as the input signal.

The complex multiplier 25 performs the complex multiplication of the difference of the distortion correction coefficients input from the adder 24 and the input signal (the input signal from the delay control section 27 in the present embodiment) from the memory-less PD 1, and outputs the result of the complex multiplication to the adder 26. In the result of the complex multiplication, the inverse characteristic of the distortion caused by the memory effect, for example, is represented as a form of a sum, and the baseband even number distortion corresponds to the signal for correcting the distortion generated by remodulating the fundamental wave by making the power supply voltage vary by the differential of the inductance 92 provided to the model shown in FIG. 8, for example.

The delay control section 28 delays the input signal and outputs it to the adder 26. In this case, the amount of the delay is controlled so that the output from the complex multiplier 25 corresponding to the input signal (the output from the complex multiplier 13) is input to the adder 26 at the same timing as the input signal.

The adder 26 adds the input signal (the input signal from the delay control section 28 in the present embodiment) from the memory-less PD 1 and the signal resulted from the complex multiplication input from the complex multiplier 25 with each other and outputs the result. The output signal is output from the predistorter of the present embodiment.

It should be noted that using the time t, the distortion correction coefficient α(t) output from the LUT 22, the distortion correction coefficient α(t−1) delayed for one sample and output from the delay section 23, and the input signal X(t) from the memory-less PD 1, the output signal Y(t) from the memory PD 2 can be described as Formula 3.

(Mathematical Formula 3)

$$Y(t)=\{1+\alpha(t)-\alpha(t-1)\}X(t) \quad \text{(Formula 3)}$$

As described above, in the memory PD 2, the amplitude of the signal previously provided with distortion by the memory-less PD 1 is detected again, and the LUT 22 for the memory PD 2 is referred to in accordance with the information of the detected amplitude to correct the distortion by the memory effect.

In the signal output from the predistorter according to the present embodiment, the characteristic for correcting the distortion caused by the AM-AM characteristic and the AM-PM characteristic of the amplifier to be the correction target is previously provided by the memory-less PD 1, and further, the characteristic for correcting the distortion caused by the memory effect is previously provided by the memory PD 2, thus these distortion can be corrected.

It should be noted that the table values of the LUT 22 can be made automatically converge into the optimal values using, for example, various known adaptation algorisms.

Figure 2:
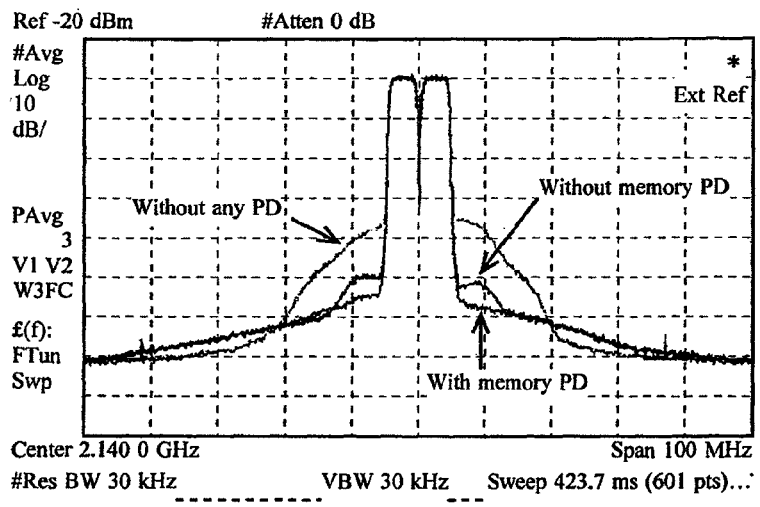
FIGS. 2(a), 2(b), and 2(c) are diagrams showing an example of the advantageous effect obtained by the predistorter according to the first embodiment of the invention.
Figure 2:
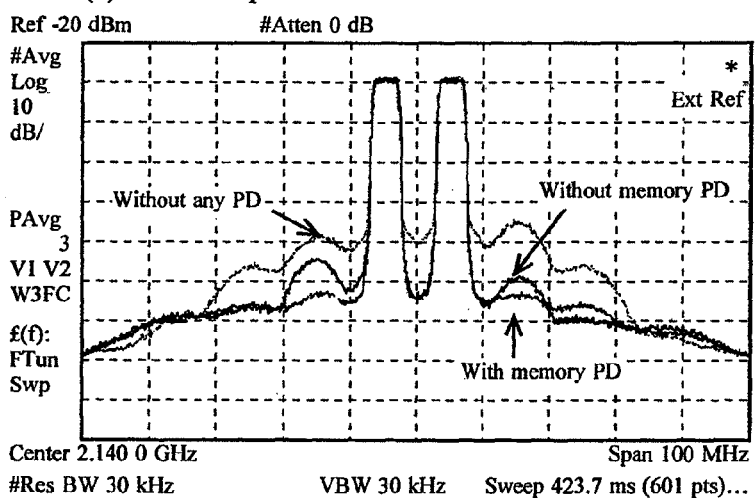
Figure 2:
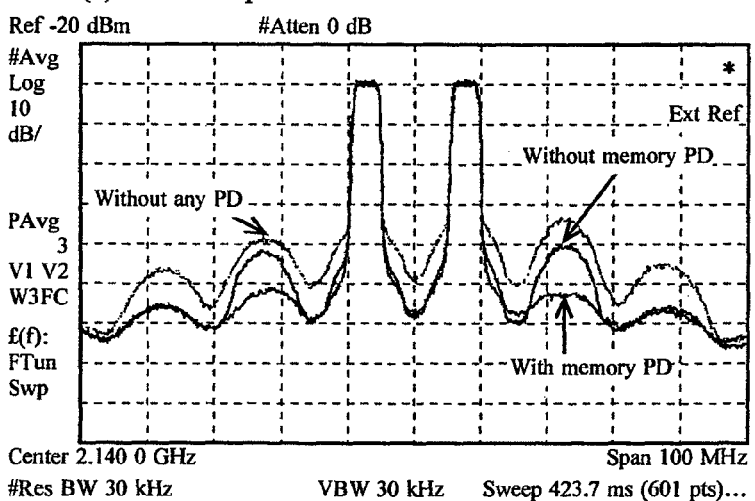

FIGS. 2(*a*), 2(*b*), 2(*c*) show examples of spectrum as the experimental result regarding the advantageous effects obtained by the predistorter according to the present embodiment.

Figure 7:
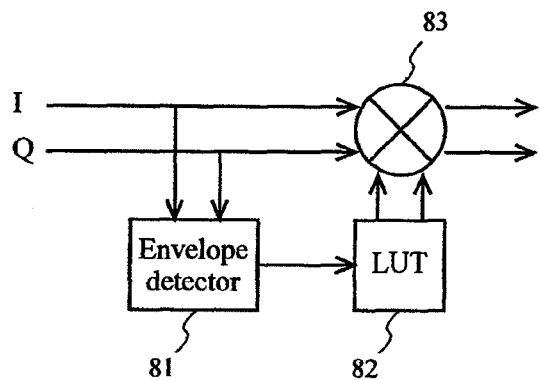
FIG. 7 is a diagram showing a configuration example of the predistorter.

In each of the graphs, the horizontal axis represents the frequency, and the vertical axis represents the power level of the signal. Further, in each of the graphs, equal level 2 carriers of 3 GPP test model 1 are used as the input signal, and there are shown the spectrums regarding "without any PD" which is the case of performing no distortion correction at all, "without memory PD" which is the case of performing the distortion correction by the predistorter without the memory PD 2 as shown in FIG. 7, for example, and "with memory PD" which is the case of performing the distortion correction by the predistorter with the memory PD 2 as is the case with the present embodiment.

Further, regarding the two carriers, FIG. 2(*a*) shows the case of 5 MHz separation, FIG. 2(*b*) shows the case of 10 MHz separation, and FIG. 2(*c*) shows the case of 15 MHz separation.

In either case, the predistorter according to the present embodiment corrects the effect of the memory effect as much as 5 through 10 dB, and the advantageous effect has actually been obtained.

As described above, according to the predistorter of the present embodiment, the parameters (the distortion correction coefficients) for the case of the distortion correction are separately provided to the distortion caused by the memory effect and other distortion (the distortion caused by the AM-AM characteristic and the AM-PM characteristic in the present embodiment), and further, the LUT 12, 22 are provided as completely separated bodies for the distortion caused by the memory effect and other distortion, thus the effect of the memory effect can be corrected using the time difference of the retrieved values from the LUT 22 for the memory effect. In the present embodiment, in order for correcting the differential effect of the power supply voltage variation caused by the influence of the inductor 92 included in the model shown in FIG. 8, the difference of the coefficients of the distortion correction table (LUT) 22 is used.

It should be noted here that although in the present embodiment, the configuration for detecting the amplitude information of the signal by the envelope detectors 11, 21 to retrieve the distortion correction coefficients from the LUT 12, 22 is shown in the memory-less PD 1 and the memory PD 2, the configuration for detecting the electric power information of the signal and retrieving the distortion correction coefficients in accordance with the electric power information can be used as another configuration example.

Further, as the configuration for storing the table values in the LUT 12, 22, for example, a configuration for previously storing the table values in correspondence with various input signal levels (amplitude or power) can be used, or alternatively, a configuration for storing the table values by expressing with a mathematical formula as a function of the input signal level and calculating the table values in every occasion can also be used.

For example, the table contents of the LUT 12, 22 can also be generated using the expansion into power series to perform approximate interpolation, and it is possible to generate coefficients composed of even number order components such as a second order component, a fourth order component, or a sixth order component. As a specific example, it is possible to set the table values LUT(x) of the LUT 12, 22 as follows. LUT(x)=1+Ax$^2$+Bx$^4$+Cx$^6$+ . . . . Here, x denotes an address value of the LUT 12, 22, and at the same time, quantized amplitude (or electric power) of the input signal. Further, A, B, and C are complex numbers, and at the same time, parameters each representing the amplitude and the phase of the even number order term.

Further, in the present embodiment, the configuration of connecting the memory-less PD 1 and the memory PD 2 in series with each other is described as a preferable configuration example. In general, the nonlinear distortion caused by the AM-AM characteristic and AM-PM characteristic is larger in comparison with the distortion caused by the memory effect, and the memory-less PD 1 corrects the signal amplitude more largely in comparison with the memory PD 2, and further the memory effect depends on the input (namely, the signal whose amplitude and phase are already corrected by the predistortion) to the amplifier. Therefore, it is thought that the best characteristic can be obtained by the serial arrangement disposing the memory PD 2 posterior to the memory-less PD 1 as is the case with the configuration of the present embodiment. It should be noted that the LUT 22 can obtain the amplitude information from the envelope detector 11 instead of the envelope detector 21.

Further, in the predistorter according to the present embodiment, in the memory PD 2, level detection means is configured by the function of the envelope detector 21, coefficient output means is configured by the function of the LUT 22, delay means is configured by the function of the delay section 23, difference detection means is configured by the function of the adder 24, multiplication means is configured by the function of the complex multiplier 25, and combination means is configured by the function of the adder 26.

Second Embodiment

A second embodiment of the invention will be explained.

Figure 3:
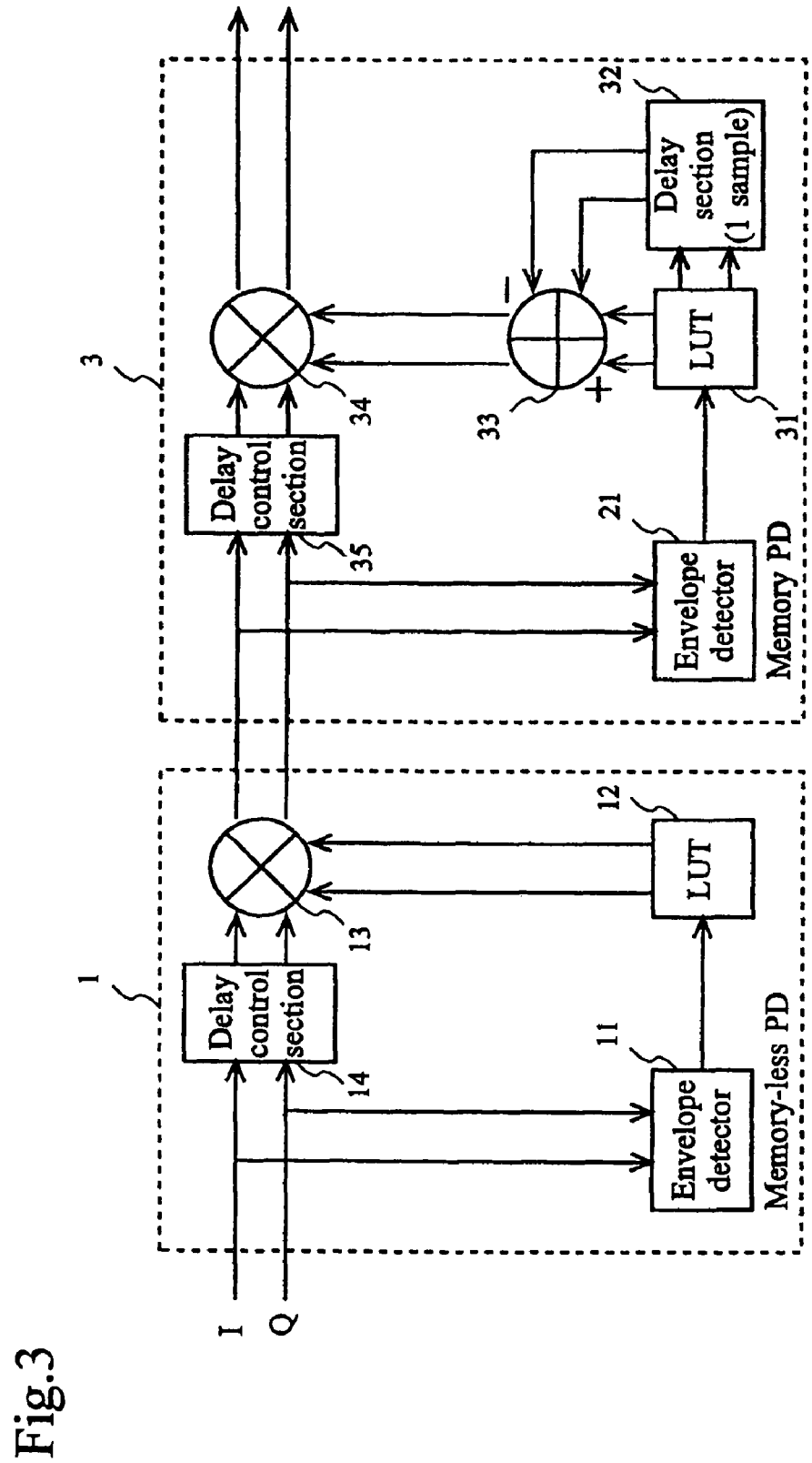
FIG. 3 is a diagram showing a configuration example of a predistorter according to a second embodiment of the invention.

FIG. 3 shows a configuration example of the predistorter for performing digital processing.

It should be noted that the same components as shown in FIG. 1 are denoted with the same reference numerals.

The predistorter according to the present embodiment is composed of the memory effect-less predistorter (memory-less PD) 1 and a memory effect predistorter (memory PD) 3.

It should be noted here that the configuration and the operation of the memory-less PD 1 are the same as those shown in FIG. 1.

The memory PD 3 according to this embodiment is provided with the envelope detector 21, a look-up table (LUT) 31 as a distortion correction table composed by using a memory or the like, a delay section 32 for one sampling period, an adder 33, a complex multiplier 34, and a delay control section 35 composed of a shift register or the like.

An example of an operation performed by the memory PD 3 according to the present embodiment will be described.

The signal input from the memory-less PD 1 is input to the envelope detector 21 and the delay control section 35.

The envelope detector 21 has a similar function to, for example, what is shown in FIG. 1, and detects the envelope of the input signal as the amplitude information, and outputs the detection result to the LUT 31.

The LUT 31 stores the distortion correction coefficients, which are capable of generating the inverse characteristic (namely the cancellation characteristic) to the distortion caused by the memory effect, as the IQ vectors, in correspondence with the amplitude information of the input signal as the reference argument (address). The LUT 31 outputs the table value (the distortion correction coefficient), which is stored in the address corresponding to the amplitude information of the input signal as the detection result input from the envelope detector 21, to the delay section 32 and the adder 33.

The delay section 32 is composed of a delay element or the like for delaying the signal for one sampling period in the present embodiment, and delays the distortion correction coefficients input from the LUT 31 for one sampling period and outputs it to the adder 33.

The adder 33 has a function of calculating the difference between the two signals input thereto, and outputs the result (difference) of subtracting the distortion correction coefficient input from the delay section 32 from the distortion correction coefficient input from the LUT 31 to the complex multiplier 34.

The delay control section 35 delays the input signal and outputs it to the complex multiplier 34. In this case, the amount of the delay is controlled so that the output from the adder 33 corresponding to the input signal (the output from the complex multiplier 13) is input to the complex multiplier 34 at the same timing as the input signal.

The complex multiplier 34 performs the complex multiplication of the difference of the distortion correction coefficients input from the adder 33 and the input signal (the input signal from the delay control section 35 in the present embodiment) from the memory-less PD 1, and outputs the result of the complex multiplication. The output signal is output from the predistorter of the present embodiment.

It should be noted that using the time t, the distortion correction coefficient β(t) output from the LUT 31, the distortion correction coefficient β(t−1) delayed for one sample and output from the delay section 32, and the input signal X(t) from the memory-less PD 1, the output signal Y(t) from the memory PD 3 can be described as Formula 4.

Assuming that Formula 3 described above and Formula 4 are equal to each other, the following is obtained.

(Mathematical Formula 4)

$\{1+\alpha(t)-\alpha(t-1)\}=\{\beta(t)-\beta(t-1)\}$ $Y(t)=\{\beta(t)-\beta(t-1)\}X(t)$ (Formula 4)

As described above, since the predistorter according to the present embodiment has a configuration in which the complex multiplication is performed on the output from the adder 33 and the input from the memory-less PD 1, the table values of the LUT 31 have a characteristic represented by multiplication.

Further, the table values of the LUT 31 can be made automatically converge into the optimal values using, for example, various known adaptation algorisms.

As described above, according to the predistorter of the present embodiment, the parameters (the distortion correction coefficients) for the case of the distortion correction are separately provided to the distortion caused by the memory effect and other distortion (the distortion caused by the AM-AM characteristic and the AM-PM characteristic in the present embodiment), and further, the LUT 12, 31 are provided as completely separated bodies for the distortion caused by the memory effect and other distortion, thus the effect of the memory effect can be corrected using the time difference of the retrieved values from the LUT 31 for the memory effect. In the present embodiment, in order for correcting the differential effect of the power supply voltage variation caused by the influence of the inductor 92 included in the model shown in FIG. 8, the difference of the coefficients of the distortion correction table (LUT) 31 is used.

Further, in the predistorter according to the present embodiment, in the memory PD 3, level detection means is configured by the function of the envelope detector 21, coefficient output means is configured by the function of the LUT 31, delay means is configured by the function of the delay section 32, difference detection means is configured by the function of the adder 33, and multiplication means is configured by the function of the complex multiplier 34.

Third Embodiment

A third embodiment of the invention will be explained.

Figure 4:
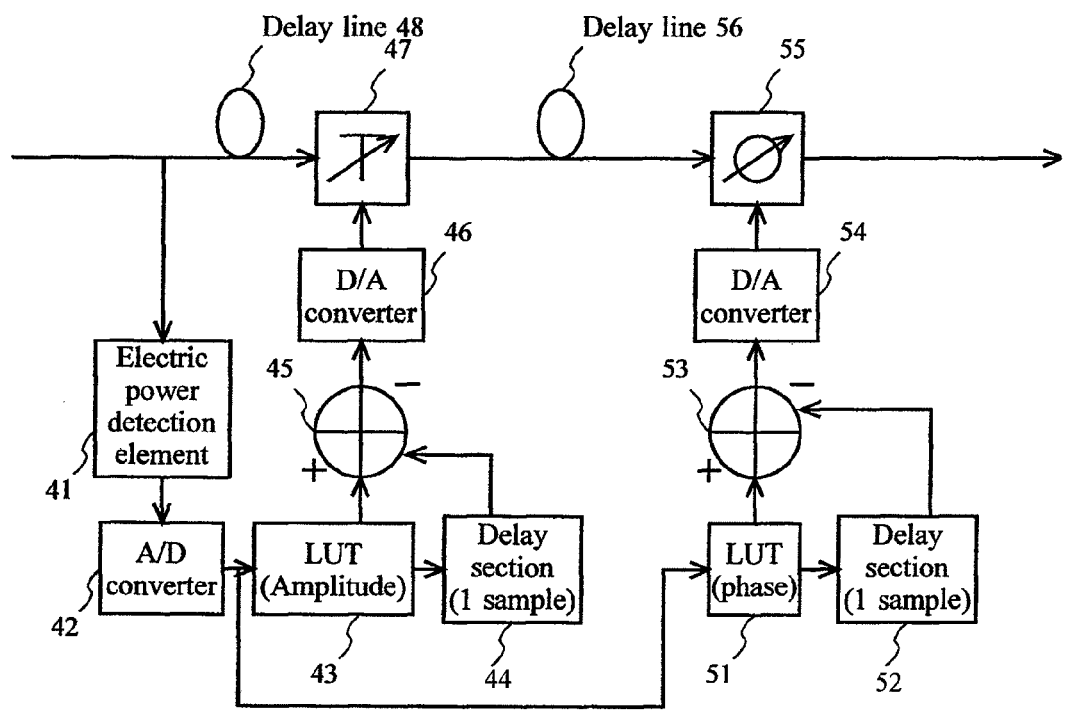
FIG. 4 is a diagram showing a configuration example of a memory effect predistorter according to a third embodiment of the invention.

FIG. 4 shows a configuration example of the memory effect predistorter for correct the effect of the memory effect by performing an analog process.

In the memory effect predistorter according to the present embodiment, the predistortion process can be performed on the input signal in the intermediate frequency (IF) band or the radio frequency (RF) band.

The memory effect predistorter according to the present embodiment is provided with an electric power detection element 41 composed of, for example, a log amplifier, and an analog-to-digital (A/D) converter 42, and for controlling the amplitude, the predistorter is further provided with a look-up table (LUT) 43 as a distortion correction table composed by using a memory or the like, a delay section 44 for one sample delay, an adder 45, a digital-to-analog (D/A) converter 46, and a variable attenuator 47 for modulating the amplitude, and for controlling the phase, the predistorter is also provided with a look-up table (LUT) 51 as a distortion correction table composed by using a memory or the like, a delay section 52 for one sample delay, an adder 53, a D/A converter 54, and a variable phase shifter 55 for modulating the phase. Further, the memory effect predistorter is provided with a delay line 48 and a delay line 56.

An example of an operation performed by the memory effect predistorter according to the present embodiment will be described.

The input signal to the memory effect predistorter according to the present embodiment is input to the electric power detection element 41, and also to the variable attenuator 47 via the delay line 48.

The electric power detection element 41 detects the power of the input signal, and outputs the detection result to the A/D converter 42.

The A/D converter 42 converts the signal of the detection result input from the electric power detection element 41 from an analog signal into a digital signal, and outputs it to the LUT 43 for the amplitude control and the LUT 51 for the phase control.

The LUT 43 for the amplitude control stores the distortion correction coefficients (the distortion correction characteristic of the amplitude), which are capable of generating the inverse characteristic (namely the cancellation characteristic) to the amplitude distortion caused by the memory effect, in correspondence with the electric power information of the input signal as the reference argument (address). The LUT 43 for the amplitude control outputs the table value (the distortion correction coefficient), which is stored in the address corresponding to the electric power information of the input signal as the detection result input from the A/D converter 42, to the delay section 44 and the adder 45.

The delay section 44 for the amplitude control is composed of a delay element or the like for delaying the signal for one sampling period in the present embodiment, and delays the distortion correction coefficients input from the LUT 43 for one sampling period and outputs it to the adder 45.

The adder 45 for the amplitude control has a function of calculating the difference between the two signals input thereto, and outputs the result (difference) of subtracting the distortion correction coefficient input from the delay section 44 from the distortion correction coefficient input from the LUT 43 to the D/A converter 46.

The D/A converter 46 for the amplitude control converts the difference signal input from the adder 45 from a digital signal to an analog signal, and outputs it to the variable attenuator 47.

The delay line 48 delays the input signal and outputs it to the variable attenuator 47. In this case, the amount of the delay is controlled so that the signal for controlling the amplitude (the output from the D/A converter 46) corresponding to the input signal is input to the variable attenuator 47 at the same timing as the input signal.

The variable attenuator 47 attenuates the input signal (in the present embodiment, the input signal from the delay line 48) to the memory effect predistorter according to the present embodiment with an attenuation amount in accordance with the signal (e.g., electric power of the signal) input from the D/A converter 46, and outputs the signal thus attenuated to the variable phase shifter 55 via the delay line 56.

The LUT 51 for the phase control stores the distortion correction coefficients (the distortion correction characteristic of the phase), which are capable of generating the inverse characteristic (namely the cancellation characteristic) to the phase distortion caused by the memory effect, in correspondence with the electric power information of the input signal as the reference argument (address). The LUT 51 for the phase control outputs the table value (the distortion correction coefficient), which is stored in the address corresponding to the electric power information of the input signal as the detection result input from the A/D converter 42, to the delay section 52 and the adder 53.

The delay section 52 for the phase control is composed of a delay element or the like for delaying the signal for one sampling period in the present embodiment, and delays the distortion correction coefficients input from the LUT 51 for one sampling period and outputs it to the adder 53.

The adder 53 for the phase control has a function of calculating the difference between the two signals input thereto, and outputs the result (difference) of subtracting the distortion correction coefficient input from the delay section 52 from the distortion correction coefficient input from the LUT 51 to the D/A converter 54.

The D/A converter 54 for the phase control converts the difference signal input from the adder 53 from a digital signal to an analog signal, and outputs it to the variable phase shifter 55.

The delay line 56 delays the input signal (output from the variable attenuator 47), and outputs it to the variable phase shifter 55. In this case, the amount of the delay is controlled so that the signal (the output from the D/A converter 54) for controlling the phase corresponding to the input signal (output from the variable attenuator 47) is input to the variable phase shifter 55 at the same timing as the input signal.

The variable phase shifter 55 varies the phase of the signal (in the present embodiment, the input signal from the delay line 56) input from the variable attenuator 47 with the phase shift amount in accordance with the signal (e.g., the electric power of the signal) input from the D/A converter 54, and outputs the signal with the phase thus varied. The output signal is output from the memory effect predistorter of the present embodiment.

As described above, in the memory effect predistorter according to the present embodiment, the effect of the memory effect regarding the amplitude can be corrected using the time difference of the retrieved values from the LUT 43 for the amplitude control, and the effect of the memory effect regarding the phase can also be corrected using the time difference of the retrieved values from the LUT 51 for the phase control. Further, by providing the processing section for correcting the amplitude distortion and the phase distortion (in the present embodiment, the distortion derived from the AM-AM characteristic and the distortion derived from the AM-PM characteristic) other than the memory effect anteriorly in series therewith, for example, both of the distortion caused by the memory effect and other distortion can be corrected.

It should be noted here that although in the present embodiment there is presented the configuration of retrieving the distortion correction coefficients from the LUT 43, 51 by detecting the electric power information of the signal by the electric power detection element 41, there can be used a configuration, as another configuration example, of detecting the amplitude information of the signal and retrieving the distortion correction coefficients in accordance with the amplitude information.

Further, the table values of the LUT 43 for the amplitude control or the table values of the LUT 51 for the phase control can be made automatically converge into the optimal values using, for example, various known adaptation algorisms.

It should be noted that in the predistorter according to the present embodiment, the level detection means is configured by the function of the electric power detection element 41, amplitude coefficient output means is configured by the function of the LUT 43, amplitude coefficient delay means is configured by the function of the delay section 44, amplitude coefficient difference detection means is configured by the function of the adder 45, amplitude variation means is configured by the function of the variable attenuator 47, phase coefficient output means is configured by the function of the LUT 51, phase coefficient delay means is configured by the function of the delay section 52, phase coefficient difference detection means is configured by the function of the adder 53, and phase variation means is configured by the function of the variable phase shifter 55.

Fourth Embodiment

A fourth embodiment of the invention will be explained.

Figure 5:
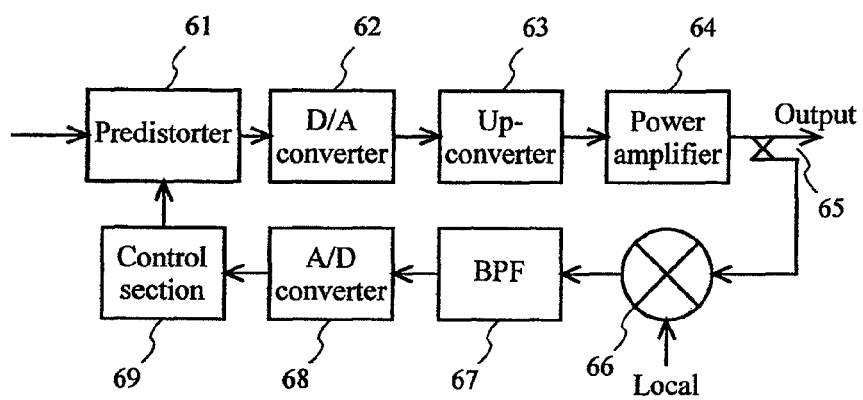
FIG. 5 is a diagram showing a configuration example of a predistorter according to a fourth embodiment of the invention.
Figure 6:
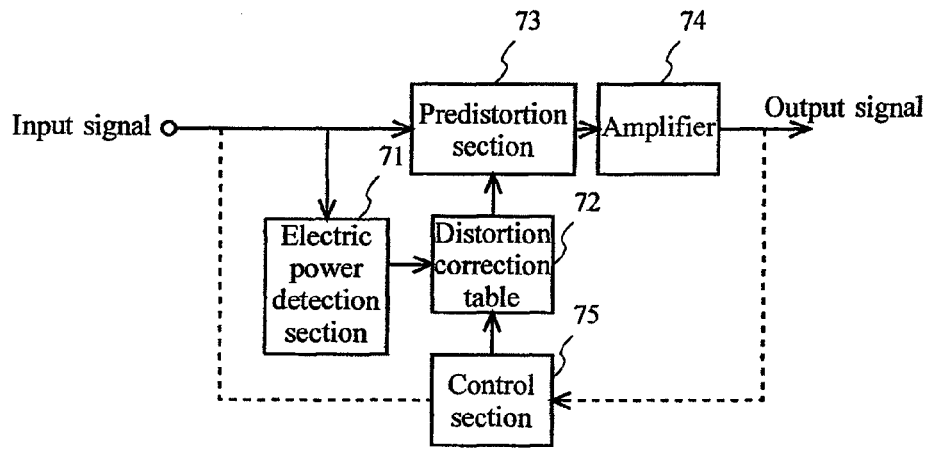
FIG. 6 is a diagram showing a configuration example of an amplifier with the predistorter.

FIG. 5 shows a configuration example of an amplifier (an amplifier with a predistorter) having a function of correcting distortion by the predistortion method.

The amplifier with a predistorter according to the present embodiment is provided with a predistorter 61, a D/A converter 62, an up-converter 63, a power amplifier 64, a directional coupler 65, a mixer 66, a bandpass filter (BPF) 67, an A/D converter 68, and a control section 69.

Here, what corrects both the distortion caused by the memory effect and other distortion by performing digital processing such as the predistorter shown in FIG. 1 or the predistorter shown in FIG. 3 is used as the predistorter 61. It should be noted that as another configuration example, the predistorter having the memory effect predistorter shown in FIG. 4 can be used as the predistorter for performing an analog process.

An example of an operation performed by the amplifier with predistorter according to the present embodiment will be described.

The input signal to the amplifier with a predistorter according to the present embodiment is input to the predistorter 61.

The predistorter 61 generates distortion (predistortion) to the input signal by the predistortion method, and outputs the signal with the generated distortion to the D/A converter 62.

The D/A converter 62 converts the signal input from the predistorter 61 from a digital signal to an analog signal, and outputs it to the up-converter 63.

The up-converter 63 performs up-conversion of performing frequency conversion of the frequency band of the signal input from the D/A converter 62 to the RF band, and outputs the signal with the frequency thus converted to the power amplifier 64.

The power amplifier 64 amplifies and then outputs the signal input from the up-converter 63. The output signal is output from the amplifier with the predistorter according to the present embodiment. Further, the distortion caused in the amplifier 64 and the distortion generated by the predistorter 61 cancel each other to reduce (correct) the distortion caused in the power amplifier 64.

The directional coupler 65 extracts a part of the amplified signal output from the power amplifier 64 and outputs it to the mixer 66. The extracted signal is used as a feedback signal for controlling the predistorter 61.

The mixer 66 inputs a signal with a predetermined frequency (a local frequency), and mixes the signal with the signal input from the directional coupler 65, thereby performing down-conversion of performing frequency conversion of the frequency band of the signal input from the directional coupler 65 to the baseband band, and thus the signal after the frequency conversion is output to the bandpass filter 67.

The bandpass filter 67 removes an unnecessary wave from the signal input from the mixer 66, and output the signal from which the unnecessary wave has been removed to the A/D converter 68.

The A/D converter 68 converts the signal input from the bandpass filter 67 from an analog signal to a digital signal, and outputs it to the control section 69.

The control section 69 controls the table values (note, if a mathematical formula is used, the coefficients thereof) of the distortion correction table provided to the predistorter 61 so as to sequentially adapt to the temperature variation, the secular variation, and so on in accordance with the signal input from the A/D converter 68, using, for example, a method of reducing by measuring the electric power of the distortion included in the amplified signal or a method of reducing by obtaining the error caused by the distortion by comparing the signal before entering the amplifier with the amplified signal.

It should be noted that if what is shown in FIG. 1 is used as the predistorter 61 according to the present embodiment, the distortion caused by the memory effect and other distortion (in the present embodiment, the distortion caused by the AM-AM characteristic and the AM-PM characteristic) can be corrected by independently adaptively updating the LUT 22 and the LUT 12, respectively. In this case, the way of performing the distortion correction by the predistorter 61 can be controlled so as to adapt to the temperature variation, the secular variation, and so on. In particular, when adaptively updating the LUT 22, the control of detecting the distortion by the memory effect and reducing the distortion is preferable, and it is possible to detect, for example, the difference (imbalance amount) in the electric power between the upper side and the lower side of the intermodulation distortion appearing out-of-band, and to perform the control so as to minimize the amount.

It should be noted here that the configurations of the predistorter, the amplifier with a predistorter, and so on according to the invention are not necessarily limited to those described above, but various configurations can be used therefor. Further, the present invention can be provided as a method or a formula of performing the process according to the present invention, a program for realizing such a method or a formula, a recording medium for recording the program, or the like, and further, the present invention can also be provided as various devices or systems.

Further, the application field of the present invention is not necessarily limited to those described above, and the present invention can be applied to various fields.

Still further, as the various processes performed by the predistorter or the amplifier with a predistorter according to the present invention, the configuration controlled by the processor performing the control program stored in the read only memory (ROM) in the hardware resource provided with the processor, the memory, and so on, for example, can be used, or each functional means for performing the process can be configured as an independent hardware circuit.

Still further, the present invention can also be understood as the computer readable recording medium such as a floppy (registered trademark) disk or a compact disc (CD)-ROM storing the control program described above or the program (itself), and by inputting the control program to the computer from the recording medium, and making the processor perform the control program, the process according to the present invention can be performed.

INDUSTRIAL APPLICABILITY

As described above, according to the predistorter relating to the present invention, by the configuration for performing the distortion correction by the predistortion method using the time difference of the coefficient in accordance with the level of the signal to be the target of amplification by the amplifier, the effect of the memory effect can efficiently be corrected, and by combining, for example, with the configuration for correcting the effects other than the memory effect such as the AM-AM characteristic and the AM-PM characteristic, the distortion correction, which is effective as a whole, can be performed.

The invention claimed is:

1. A predistorter for correcting distortion caused by a memory effect in amplifying a signal by an amplifier, comprising:
    level detection means for detecting a level of the signal;
    coefficient output means for outputting a coefficient corresponding to the detected level;
    delay means for delaying the output coefficient;
    difference detection means for detecting the difference between the output coefficient and the delayed coefficient;
    multiplication means for multiplying the detected difference with the signal;
    combination means for combining the result of the multiplication with the signal,
    wherein the result of the combination is output to the amplifier.

* * * * *